(12) United States Patent
Saita et al.

(10) Patent No.: US 8,299,350 B2
(45) Date of Patent: Oct. 30, 2012

(54) SOLAR CELL MODULE AND METHOD FOR MANUFACTURING THE SAME

(75) Inventors: Atsushi Saita, Kobe (JP); Yukihiro Yoshimine, Kobe (JP); Shigeyuki Okamoto, Kobe (JP); Yasufumi Tsunomura, Takasago (JP); Shigeharu Taira, Amagasaki (JP); Hiroshi Kanno, Kobe (JP); Haruhisa Hashimoto, Minoh (JP)

(73) Assignee: Sanyo Electric Co., Ltd., Moriguchi-shi (JP)

( * ) Notice: Subject to any disclaimer, the term of this patent is extended or adjusted under 35 U.S.C. 154(b) by 340 days.

(21) Appl. No.: 12/184,400

(22) Filed: Aug. 1, 2008

(65) Prior Publication Data
US 2009/0032081 A1   Feb. 5, 2009

(30) Foreign Application Priority Data

Aug. 2, 2007 (JP) ................................. 2007-202265
Dec. 28, 2007 (JP) ................................. 2007-341070

(51) Int. Cl.
*H01L 31/042* (2006.01)
*H01L 31/00* (2006.01)
*H02N 6/00* (2006.01)

(52) U.S. Cl. ........................................ 136/244; 136/256

(58) Field of Classification Search .................. 136/244, 136/256
See application file for complete search history.

(56) References Cited

U.S. PATENT DOCUMENTS

| 5,084,107 A * | 1/1992 | Deguchi et al. ............... 136/256 |
| 6,833,180 B1 | 12/2004 | Kodemura |
| 7,754,973 B2 | 7/2010 | Shiomi et al. |
| 2002/0139415 A1 | 10/2002 | Shimizu et al. |
| 2004/0200522 A1 * | 10/2004 | Fukawa et al. ................ 136/259 |
| 2007/0235077 A1 * | 10/2007 | Nagata et al. ................. 136/256 |

FOREIGN PATENT DOCUMENTS

| EP | 0995784 A1 | 4/2000 |
| JP | 11-021660 A | 1/1999 |
| JP | 2000-261012 A | 9/2000 |
| JP | 2005-101519 A | 4/2005 |
| JP | 2005-191200 A | 7/2005 |
| WO | 2005/114751 A | 12/2005 |

* cited by examiner

*Primary Examiner* — Jonathan Johnson
*Assistant Examiner* — Allison Bourke
(74) *Attorney, Agent, or Firm* — Marvin A. Motsenbocker; Mots Law, PLLC

(57) ABSTRACT

With the method for manufacturing the solar cell module 100 according to the present embodiment, the width W1 of the connection region C in which the wiring member 11 and the connecting electrode 40 are electrically connected is set to be larger than the substantially half of the width W2 of the wiring member 11 in the thermocompression bonding process of the wiring member 11 using the resin adhesive 12 including the particles 13 onto the principal surface of the solar cell 10.

4 Claims, 10 Drawing Sheets

SOLAR CELL MODULE AND METHOD FOR MANUFACTURING THE SAME

CROSS REFERENCE TO RELATED APPLICATIONS

This application is based upon and claims the benefit of priority from the prior Japanese Patent Application No. P 2007-202265, filed on Aug. 2, 2007, and the prior Japanese Patent Application No. P 2007-341070, filed on Dec. 28, 2007; the entire contents of which are incorporated herein by reference.

BACKGROUND OF THE INVENTION

1. Field of the Invention

The present invention relates to a solar cell module in which a resin adhesive is provided between a wiring member and a principal surface of a solar cell and a method for manufacturing the solar cell module.

2. Description of the Related Art

A solar cell can directly convert sunlight, which is clean and unlimitedly supplied energy, into electricity. Accordingly, a solar cell is expected to be a new energy source.

In general, energy output from one solar cell is approximately several watts. Accordingly, as a power source for a house, a building or the like, used is a solar cell module including multiple solar cells connected to each other to provide enhanced energy output. A solar cell module is configured by connecting multiple solar cells arranged in one or more lines in a first direction by using wiring members. The wiring members are generally soldered on the principal surfaces of the solar cells.

Here, a technique has been disclosed in which a resin adhesive member, which is thermoset at a lower temperature than a melting temperature of solder, is inserted between a wiring member and a principal surface of a solar cell so as to cause the wiring member to thermally adhere onto the principal surface of the solar cell (see, for example, Japanese Patent Application Publication No. 2005-101519).

According to such a technique, an impact of temperature changes, caused by the thermal adhesion of the wiring member, upon the solar cell can be made smaller than the case where the wiring member is soldered thereon.

SUMMARY OF THE INVENTION

A first aspect of the present invention provides a solar cell module comprising first and second solar cells arranged in a line in a first direction and a wiring member electrically connecting the first and second solar cells. In the solar cell module, the first and second solar cells each include a photoelectric conversion part configured to produce photogenerated carriers by receiving light and a collecting electrode which is formed on a principal surface of the photoelectric conversion part and is configured to collect the photogenerated carriers, the wiring member is provided in the first direction on the principal surfaces of the first and second solar cells, a resin adhesive is provided between the wiring member and the principal surfaces of the first and second solar cells, a circumference of a cross section of the wiring member is convexly formed toward the first and second solar cells, the cross section being substantially perpendicular to the first direction, and in a second direction substantially perpendicular to the first direction, a width of a connection region in which the wiring member and the collecting electrode are electrically connected is larger than a substantially half a width of the wiring member.

In the first aspect of the present invention, the collecting electrode may include a plurality of thin wire electrodes configured to collect the photogenerated carriers from the photoelectric conversion part and a connecting electrode configured to collect the photogenerated carriers from the thin wire electrodes. The connecting electrode may be formed in the first direction, the wiring member is provided on the connecting electrode. The resin adhesive may include a plurality of conductive particles. The connection region may be formed by the particles included in the resin adhesive. In addition, it is preferable that the connecting electrode have a protruding portion convexly formed toward the wiring member, the protruding portion be formed in an edge portion of the connecting electrode in the second direction, and the protruding portion dig in the wiring member.

In the first aspect of the present invention, the collecting electrode may include a plurality of thin wire electrodes configured to collect the photogenerated carriers from the photoelectric conversion part. In addition, the connection region may be formed by embedding portions of the thin wire electrodes in the wiring member.

A second aspect of the present invention provides a method for manufacturing a solar cell module that including first and second solar cells arranged in a line in a first direction and a wiring member electrically connecting the first and second solar cells. The method comprises the step (A) of manufacturing the first and second solar cells by forming a collecting electrode configured to collect photogenerated carriers on a principal surface of a photoelectric conversion part configured to produce the photogenerated carriers by receiving light. The method also comprises the step (B) of thermocompressively bonding the wiring member onto principal surfaces of the first and second solar cells in the first direction with a resin adhesive. In the solar cell module, a circumference of a cross section of the wiring member is convexly formed toward the first and second solar cells. The cross section is substantially perpendicular to the first direction, and in the step of (B), a width of a connection region in which the wiring member and the collecting electrode are electrically connected is set larger than a substantially half a width of the wiring member in a second direction perpendicular to the first direction.

According to the above-described method for manufacturing a solar cell module, the circumference of the wiring member is convexly formed toward the collecting electrode. Thus, in the thermocompression bonding process of the wiring member, a pressure is firstly applied to the center portion of the second direction of the resin adhesive and then gradually applied to edge portions thereof. In other words, the edge portions of the resin adhesive is pressed being lagged behind the center portion thereof.

Accordingly, a gas trapped in the resin adhesive is gradually pushed out from the center portion to the edge portions. In other words, degassing of the resin adhesive is gradually carried out from the center portion to the edge portions. As described above, the degassing of the resin adhesive is promoted. Thereby, a mass of the gas can be prevented from being residual as a cavity in the resin adhesive after the thermocompression bonding process of the wiring member.

In addition, in the thermocompression bonding process of the wiring member, the width of the connection region is set to be larger than the substantially half a width of the wiring member. Thereby, electrical connection between the wiring member and the collecting electrode can be sufficiently secured.

In the second aspect of the present invention, the resin adhesive may include a plurality of conductive particles. In the step of (B), the width of the connection region is set larger than a substantially half a width of the wiring member by setting a diameter of each particle included in the resin adhesive to a predetermined diameter or larger.

In the second aspect of the present invention, in the step of (B), the width of the connection region is set larger than a substantially half a width of the wiring member by setting a pressure in thermocompressively bonding the wiring member onto the principal surfaces of the first and second solar cells to a predetermined pressure or larger.

DETAILED DESCRIPTION OF THE EMBODIMENTS

Figure 1:
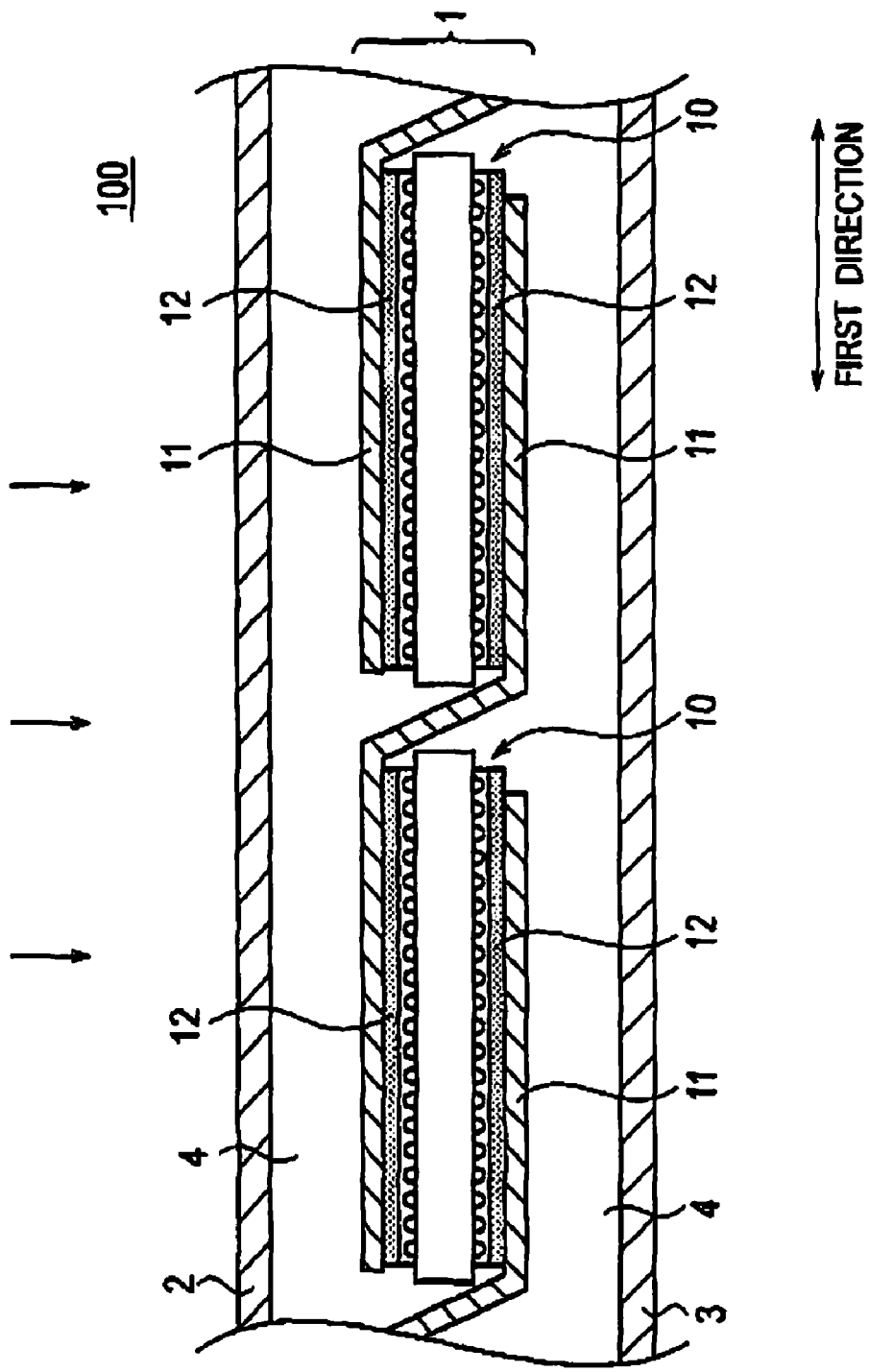
FIG. 1 is a side view of a solar cell module 100 according to a first embodiment of the present invention.

Preferred embodiments of the present invention will be described below by referring to the drawings. In the following description of the drawings, the same or similar reference numerals are given to denote same or similar portions. Note that the drawings are merely schematically shown and proportions of sizes and the like are different from actual ones. Thus, specific sizes or the like should be determined by referring to the following description. In addition, there are of course included portions where relationships or proportions of sizes in the drawings each are different with respect to one another.

1. First Embodiment (Schematic Configuration of a Solar Cell Module)

A schematic configuration of a solar cell module 100 according to a first embodiment of the present invention will be described by referring to FIG. 1. FIG. 1 is an enlarged side view of the solar cell module 100 according to the present embodiment.

The solar cell module 100 includes a solar cell string 1, a light-receiving surface side protection member 2, a back surface side protection member 3, and a sealing member 4. The solar cell module 100 is configured by causing the solar cell string 1 to be sealed between the light-receiving surface side protection member 2 and the back surface side protection member 3.

The solar cell string 1 includes multiple solar cells 10, wiring members 11, and a resin adhesive 12. The solar cell string 1 is configured by connecting through the wiring members 11 the multiple solar cells 10 arranged in the first direction.

The solar cell 10 has a light-receiving surface into which sunlight enters and a back surface provided on the reverse side of the light-receiving surface. The light-receiving surface and the back surface are principal surfaces of the solar cell 10. A collecting electrode is formed on the light-receiving surface and back surface of the solar cell 10. The configuration of the solar cell 10 will be described later.

The wiring member 11 is bonded to the collecting electrode formed on the light-receiving surface of one solar cell 10 and the collecting electrode formed on the back surface of another solar cell 10 adjacent to the one solar cell. Thereby, the one solar cell 10 and another solar cell 10 are electrically connected. The wiring member 11 includes a sheet-like low resistivity (such as copper) and a soft conductor (such as eutectic solder) which is plated on the surface of the low resistivity.

The resin adhesive 12 is provided between the wiring member 11 and the solar cell 10. In other words, the wiring member 11 is bonded to the solar cell 10 using the resin adhesive 12. Preferably, the resin adhesive 12 should be cured at the temperature equal to or lower than the melting point of the eutectic solder, that is, at the temperature equal to or lower than approximately 200° C. As the resin adhesive 12, for example, a two-part reactive adhesive in which a curable material is mixed in an epoxy region, acryl resin, or urethane resin can be used in addition to a thermosetting resin adhesive such as an acryl resin or polyurethane-based resin which has high flexibility. In the present embodiment, a belt-like film sheet adhesive mainly formed of an epoxy resin is used as the resin adhesive 12.

In addition, the resin adhesive 12 includes multiple conductive particles. Nickel, gold-coated nickel, or the like can be used as the conductive particles.

The light-receiving surface side protection member 2 is arranged on the light-receiving surface side of the sealing member 4 to protect the surface of the solar cell module 100. A translucent and water-shielding glass, a translucent plastic, or the like can be used as the light-receiving surface side protection member 2.

The back surface side protection member 3 is arranged on the back surface side of the sealing member 4 to protect the back surface of the solar cell module 100. As the back surface side protection member 3, a resin film, such as PET (polyethylene terephthalate) or a layered film having a structure in which an Al foil is sandwiched between resin films can be used.

The sealing member 4 seals the solar cell string 1 between the light-receiving surface side protection member 2 and the back surface side protection member 3. As the sealing member 4, a translucent resin, such as EVA, EEA, PVB, silicon, urethane, acryl, epoxy, or the like can be used.

In addition, an Al frame (unillustrated) can be attached to the circumference of the solar cell module 100 having the above-described configuration.

(Configuration of the Solar Cell)

Figure 2:
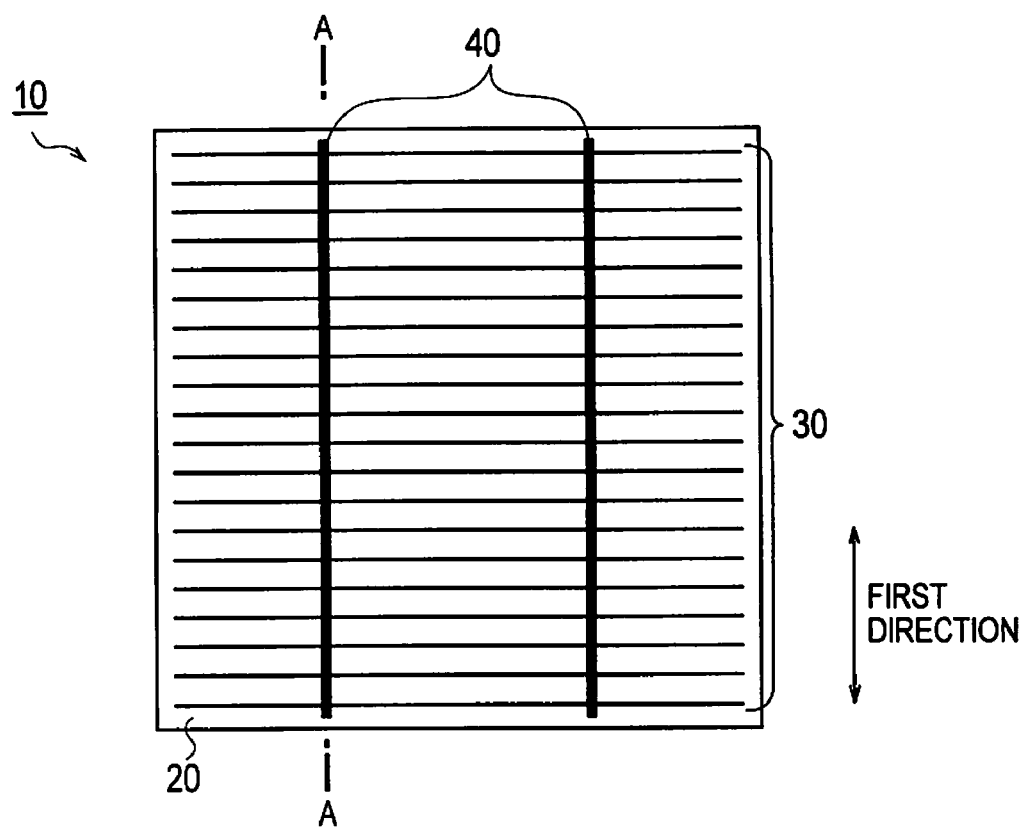
FIG. 2 is a plan view of a solar cell 10 according to the first embodiment of the present invention.

Next, the configuration of the solar cell 10 will be described by referring to FIG. 2. FIG. 2 is a plan view of the solar cell 10.

As shown in FIG. 2, the solar cell 10 includes a photoelectric conversion part 20, thin wire electrodes 30, and connecting electrodes 40.

The photoelectric conversion part 20 produces photogenerated carriers by receiving sunlight. The photogenerated carriers mean electron holes and electrons produced when sunlight is absorbed by the photoelectric conversion part 20. The photoelectric conversion part 20 has an n-type region and a p-type region inside thereof, and a semiconductor junction is formed in an interface between the n-type region and the p-type region. The photoelectric conversion part 20 can be formed by use of semiconductor substrate made of a crystalline semiconductor material, such as single crystal Si or polycrystal Si, or a compound semiconductor material, such as a compound semiconductor material, for example, GaAs or InP. Note that the photoelectric conversion part 20 may have a structure in which characteristics of a heterojunction interface are improved by inserting a substantially intrinsic amorphous silicon layer between a single crystal silicon substrate and an amorphous silicon layer, that is, a so-called heterojunction with intrinsic thin-layer (HIT) structure.

The thin wire electrode 30 is an electrode configured to collect the photogenerated carriers from the photoelectric conversion part 20. As shown in FIG. 2, the thin wire electrodes 30 are formed in a line along a second direction substantially perpendicular to the first direction. Multiple thin wire electrodes 30 are formed across the substantially entire region of the light-receiving surface of the photoelectric conversion part 20. The thin wire electrode 30 can be formed by using a resin-type conductive paste in which a resin material is used as binder and a conductive particle such as a silver particle is used as filler. As shown in FIG. 1, the thin wire electrodes 30 are similarly formed on the light-receiving surface and back surface of the photoelectric conversion part 20.

The connecting electrode 40 is an electrode configured to collect the photogenerated carriers from the multiple thin wire electrodes 30. As shown in FIG. 2, the connecting electrodes 40 are formed along the first direction so as to intersect with the thin wire electrodes 30. The connecting electrodes 40 can be formed by using a resin-type conductive paste in which a resin material is used as binder and a conductive particle such as a silver particle is used as filler. In addition, the connecting electrodes 40 are also formed on the back surface of the photoelectric conversion part 20 (Refer to FIG. 1).

Here, the number of the connecting electrodes 40 can be determined as appropriate by considering the size of the photoelectric conversion part 20 or the like. The solar cell 10 according to the present embodiment includes two connecting electrodes 40. Accordingly, the multiple thin wire electrodes 30 and the connecting electrodes 40 are formed in a lattice form on the light-receiving surface and back surface of the photoelectric conversion part 20.

Figure 3:
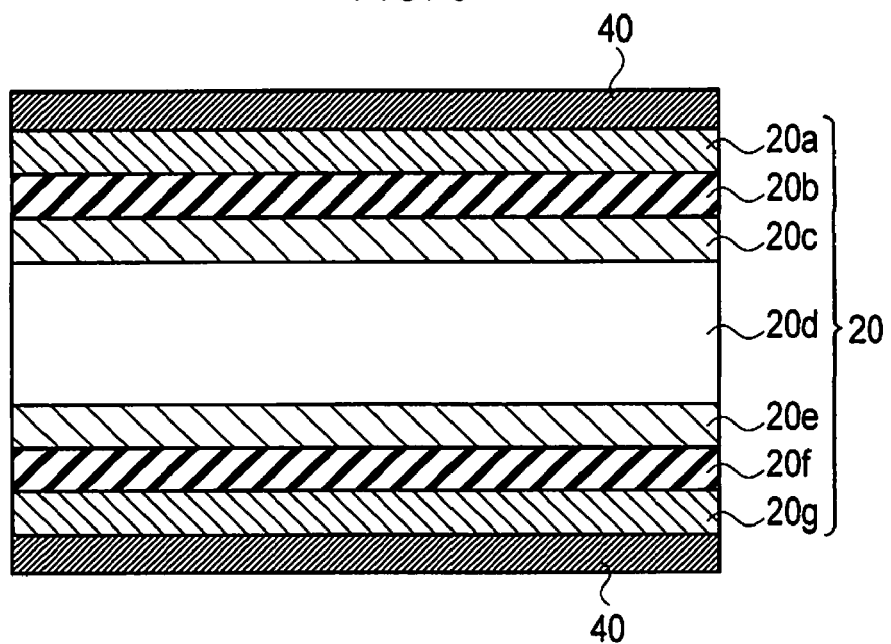
FIG. 3 is a cross-sectional view taken along the A-A line in FIG. 2.

Next, as one example of the configurations of the solar cell 10, the case where the photoelectric conversion part 20 has the HIT structure will be described by referring to FIG. 3. FIG. 3 is an enlarged cross-sectional view taken along the A-A line in FIG. 2.

As shown in FIG. 3, the photoelectric conversion part 20 includes an ITO film 20a, a p-type amorphous silicon layer 20b, an i-type amorphous silicon layer 20c, an n-type single crystal silicon substrate 20d, an i-type amorphous silicon layer 20e, an n-type amorphous silicon layer 20f, and an ITO film 20g.

The p-type amorphous silicon layer 20b is formed on the light-receiving surface side of the n-type single crystal silicon substrate 20d through the i-type amorphous silicon layer 20c. The ITO film 20a is formed on the light-receiving surface side of the p-type amorphous silicon layer 20b. In contrast, the n-type amorphous silicon layer 20f is formed on the back surface side of the n-type single crystal silicon substrate 20d through the i-type amorphous silicon layer 20e. The ITO film 20g is formed on the back surface side of the n-type amorphous silicon layer 20f.

The thin wire electrodes 30 and the connecting electrodes 40 are formed on each of the light-receiving surface side of the ITO film 20a and the back surface side of the ITO film 20g.

The solar cell module 100 having the solar cell 10 with the above-described configuration is referred to as a HIT solar cell module.

(Configuration of the Solar Cell String)

Figure 4:
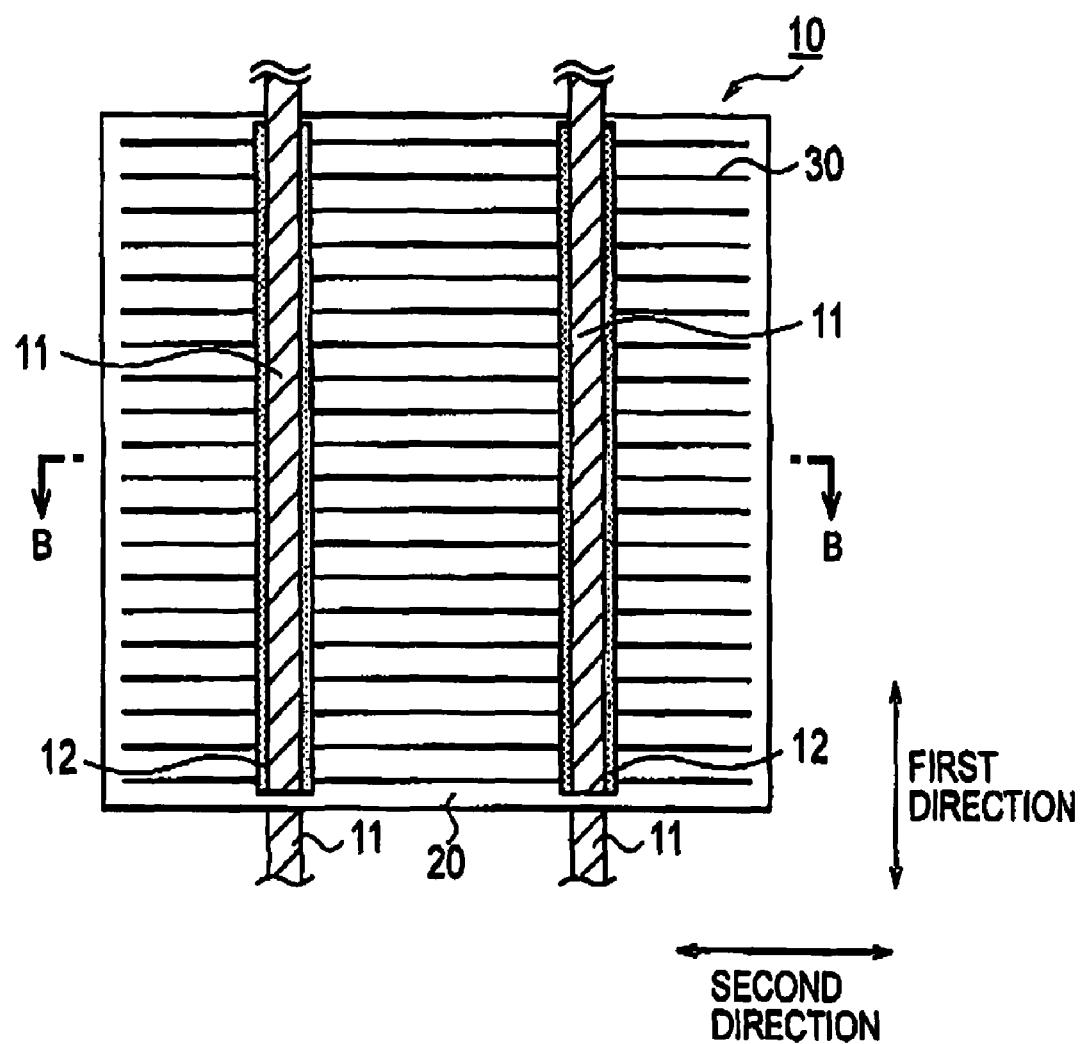
FIG. 4 is a view showing a state where a wiring member 11 is bonded to a connecting electrode 40 of FIG. 2.
Figure 5:
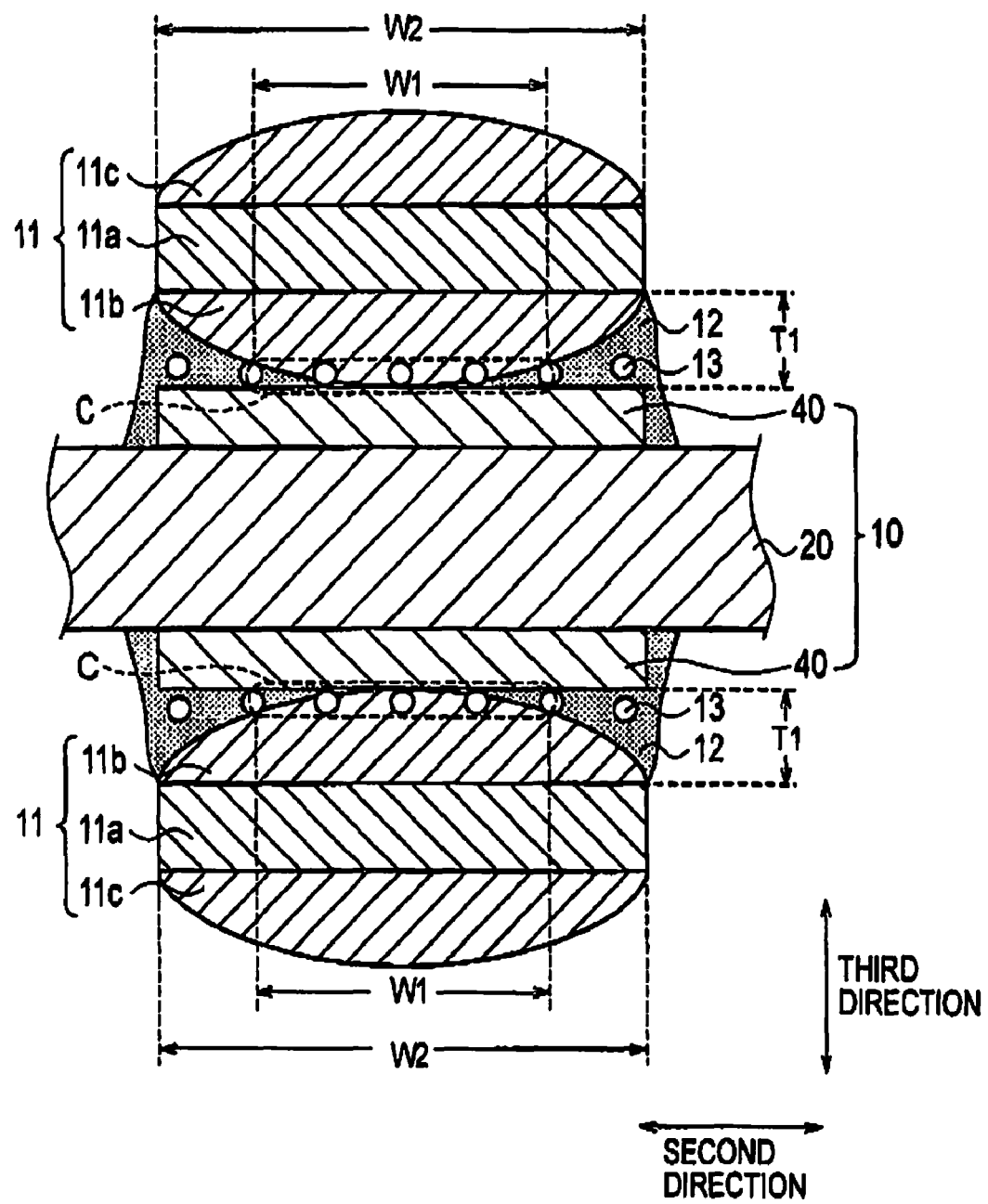
FIG. 5 is an enlarged cross-sectional view taken along the B-B line in FIG. 4.

Next, the configuration of the solar cell string 1 will be described by referring to FIGS. 4 and 5. FIG. 4 is a view showing a state where the wiring members 11 are arranged on the connecting electrode 40 shown in FIG. 2. FIG. 5 is an enlarged cross-sectional view taken along the B-B line in FIG. 4.

As shown in FIG. 4, the resin adhesive 12 is provided on the connecting electrode 40 formed in a line form along the first direction. In FIG. 4, a width of the resin adhesive 12 is set to be larger than a width of the connecting electrode 40 in the second direction. However, the configuration is not limited to this.

In addition, the wiring member 11 is arranged along the connecting electrode 40 on the resin adhesive 12. In other words, the wiring member 11 is arranged in the first direction on the principal surface of the solar cell 10. A width of the wiring member 11 in the second direction is substantially the same as a width of the connecting electrode 40.

As described above, the connecting electrode 40, the resin adhesive 12, and the wiring member 11 are sequentially arranged on the photoelectric conversion part 20. The wiring member 11 and the connecting electrode 40 are electrically connected.

As shown in FIG. 5, the wiring member 11 includes a low resistivity 11a, a soft conductor 11b, and a soft conductor 11c. The soft conductor 11b is positioned between the low resistivity 11a and the solar cell 10, while the soft conductor 11c is positioned on the low resistivity 11a. A width of the wiring member 11 in the second direction is W2.

A thickness T1 of the soft conductor 11b gradually becomes smaller from the center portion of the second direction to each edge portion of the second direction in a third direction substantially vertical to the principal surface of the solar cell 10, that is, in the thickness direction. Accordingly, the cross-sectional circumference substantially perpendicular to the first direction of the wiring member 11 is convexly formed toward the solar cell 10. As shown in FIG. 5, the wiring member 11 has similar outer shapes on the light-receiving surface side and the back surface side.

The resin adhesive 12 is inserted between the wiring member 11 and the solar cell 10. In addition, the resin adhesive 12 includes multiple conductive particles 13. As shown in FIG. 5, the multiple particles 13 include particles embedded in the soft conductor 11b, particles 13 sandwiched between the soft conductor 11b and the connecting electrode 40, or particles 13 embedded in the resin adhesive 12.

In the present embodiment, a region where the soft conductor 11b and the connecting electrode 40 are electrically connected is called as a connection region C. The connection region C is formed by the particles 13 embedded in the soft conductor 11b and the particles 13 sandwiched between the soft conductor 11b and the connecting electrode 40. Accordingly, the connection region C is a region in which a distance between the soft conductor 11b and the connecting electrode 40 is substantially the same as or smaller than that of diameter of the particle 13 in the cross-section substantially perpendicular to the first direction.

Here, a width W1 of the connection region C in the second direction is larger than a substantially half of the width W2 (W2/2) of the wiring member 11. In other words, on the both edges of the connection region C, the distance between the particles 13 each sandwiched between the soft conductor 11b and the connecting electrode 40 is larger than the substantially half of the width W2 of the wiring member 11.

(Method for Manufacturing the Solar Cell Module)

Next, a method for manufacturing the solar cell module 100 according to the present embodiment will be described.

Firstly, an n-type single crystal silicon substrate 20d in a 100 mm square is processed by anisotropic etching by using alkaline solution. Thereby, minute convex and concave are formed on the light-receiving surface of the n-type single crystal silicon substrate 20d. Then, the light-receiving surface of the n-type single crystal silicon substrate 20d is cleaned to remove impurities.

Subsequently, the i-type amorphous silicon layer 20c and the p-type amorphous silicon layer 20b are sequentially layered on the light-receiving surface side of the n-type single crystal silicon substrate 20d by using a CVD (chemical vapor deposition) method. Similarly, the i-type amorphous silicon layer 20e and the n-type amorphous silicon layer 20f are sequentially layered on the back surface side of the n-type single crystal silicon substrate 20d.

Next, the ITO film 20a is formed on the light-receiving surface side of the p-type amorphous silicon layer 20b by using a PVD (physical vapor deposition) method. Similarly, the ITO film 20g is formed on the back surface side of the n-type amorphous silicon layer 20f. As described above, the photoelectric conversion part 20 is manufactured.

Next, an epoxy-based thermosetting silver paste is arranged with a predetermined pattern on the light-receiving surface and back surface of the photoelectric conversion part 20 by using a printing method, such as a screen printing method or an offset printing method. As shown in FIG. 2, the predetermined pattern means a lattice form, which is formed by two connecting electrodes 40 extending along the first direction and the multiple thin wire electrodes 30 extending along the second direction.

The silver paste is heated under a predetermined condition to volatize the solution, and thereafter is further heated to be completely dried. In this way, the solar cell 10 is manufactured.

Figure 6:
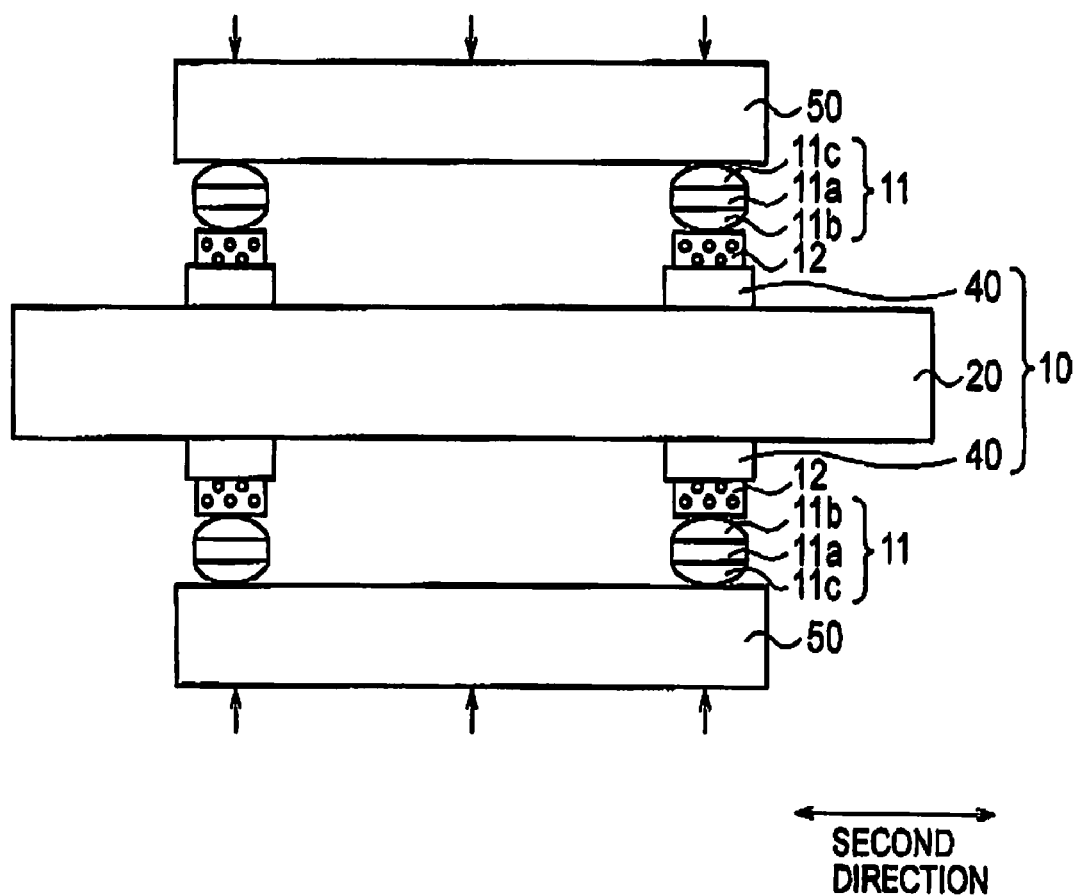
FIG. 6 is a view for illustrating a method for manufacturing the solar cell module 100 according to the first embodiment of the present invention.

Next, as shown in FIG. 6, the wiring member 11 is thermocompressively bonded onto the connecting electrode 40 using the resin adhesive 12 including the multiple particles 13. Thereby, the wiring member 11 and the solar cell 10 are mechanically and electrically connected. In specific, firstly, the resin adhesive 12 and the wiring member 11 are sequentially arranged on the connecting electrode 40 formed on each of the light-receiving surface and back surface of the photoelectric conversion part 20. Subsequently, the wiring member 11 is impressed for approximately 15 seconds to the solar cell 10 by a heater block 50 which is heated to be approximately 180° C. Thereby, the multiple particles 13 are embedded inside the soft conductor 11b and sandwiched between the soft conductor 11b and the connecting electrode 40.

Mohs hardness of nickel which is a material for the particles 13 is 3.5, Mohs hardness of solder which is a material for the soft conductor 11b is 1.8, and Mohs hardness of silver paste which is a material for the connecting electrode 40 is 2.5. For this reason, the particles 13 are embedded in the soft conductor 11b by impressing the wiring member 11 to the solar cell 10.

Here, the wiring member 11 and the solar cell 10 are electrically connected through the connection region C in which a distance between the soft conductor 11b and the connecting electrode 40 is substantially the same or smaller than the diameter of the particle 13. In the present embodiment, the width W1 of the connection region C is set to be larger than a substantially half of the width W2 of the wiring member 11 in the second direction. Specifically, the following three approaches can be employed in order to cause the width W1 of the connection region C to be larger than the substantially half of the width W2 of the wiring member 11.

In the first approach, a pressure of impressing the wiring member 11 to the solar cell 10 by the heater block 50 is set to be equal to or larger than a predetermined value. In the second approach, a diameter of the particle 13 included in the resin adhesive 12 is set to be equal to or larger than a predetermined diameter. In the third approach, a curvature of the cross-sectional circumference substantially perpendicular to the first direction of the wiring member 11 is set smaller. In other words, the third approach uses a near-flat wiring member as the wiring member 11. Specifically, a speed of pulling out the low resistivity 11a from a plating bath of the soft conductor 11b or a shape of a dice to be used for pulling out the low resistivity 11a from the plating bath is changed so as to control the curvature of the circumference of the wiring member 11.

In the actual press-fit process, the pressure of impressing the heater block 50, the diameter of the particle 13, and the curvature of the circumference of the wiring member 11 work all together integratedly, 80 that the width W1 of the connection region C is set to be larger than the substantially half of the width W2 of the wiring member 11.

As described above, the solar cell string 1 is manufactured.

After that, an EVA (sealing member 4) sheet, a solar cell string 1, an EVA (sealing member 4) sheet, and a PET sheet (back surface side protection member 3) are sequentially layered on a glass substrate (light-receiving surface side protection member 2) to form a layered body.

Then, the above-described layered body is temporarily press-fitted by thermosetting in a vacuum atmosphere, and thereafter is heated under a predetermined condition. Thereby, the EVA is completely cured. In this way, the solar cell module 100 is manufactured.

Note that a terminal box, an Al frame, or the like can be attached to the solar cell module 100.

(Advantageous Effects)

With the method for manufacturing the solar cell module 100 according to the present embodiment, the width W1 of the connection region C in which the wiring member 11 and the connecting electrode 40 are electrically connected is set to be larger than the substantially half of the width W2 of the wiring member 11 in the thermocompression bonding process of the wiring member 11 using the resin adhesive 12 including the particles 13 onto the principal surface of the solar cell 10. Accordingly, the cross-sectional circumference substantially perpendicular to the first direction of the wiring member 11 is convexly formed toward the connecting electrode 40.

As described above, the circumference of the wiring member 11 is convexly formed toward the connecting electrode 40. Thus, in the thermocompression bonding process, the pressure is firstly applied to the center portion of the second direction of the resin adhesive 12 and then is gradually applied to the edge portions thereof. In other words, the edge portions of the resin adhesive 12 is pressed being lagged behind the center portion thereof.

Accordingly, the gas trapped in the resin adhesive 12 is gradually pushed out from the center portion to the edge portions. In other words, degassing of the resin adhesive 12 is gradually carried out from the center portion to the edge portions. As described above, the degassing of the resin adhesive 12 is promoted. Thereby, a mass of the gas can be prevented from being residual as a cavity in the resin adhesive 12 after thermocompression bonding process.

In addition, in the thermocompression bonding process, the width W1 of the connection region C is set to be larger than the substantially half of the width W2 of the wiring member 11. Thereby, the electrical connection between the wiring member 11 and the solar cell 10 (connecting electrode 40) can be sufficiently secured.

Consequently, the collecting efficiency of the solar cell 10 and the adhesiveness of the wiring member 11 with the solar cell 10 (connecting electrode 40) can be improved.

In addition, in the present embodiment, the connection region C is formed by the multiple particles 13. Accordingly, the connection region C is a region in which a distance between the soft conductor 11b and the connecting electrode 40 is substantially the same as or smaller than the diameter of the particle 13 in the cross-section substantially perpendicular to the first direction.

Accordingly, the pressure of impressing the wiring member 11 to the solar cell 10 by the heater block 50 is set to be equal to or larger than the predetermined value. Thereby, the width W1 of the connection region C can be set to be larger than the substantially half of the width W2 of the wiring member 11. Also, the wiring member 11 is impressed to the solar cell 10 (connecting electrode 40) with a large pressure. Thereby, the soft conductor 11b is deformed. As a result, the width W1 of the connection region C can be set to be large.

In addition, the diameter of the particle 13 included in the resin adhesive 12 is set to be equal to or larger than the predetermined diameter. Thereby, the width W1 of the connection region C can be set to be larger than the substantially half of the width W2 of the wiring member 11. The reason is that the connection region C is a region in which a distance between the soft conductor 11b and the solar cell 10 (connecting electrode 40) is substantially equal to or smaller than the diameter of the particle 13. In this manner, by setting the diameter of the particle 13 to be larger, the width W1 of the connection region C can be set to be large.

In addition, the curvature of the cross-sectional circumference substantially perpendicular to the first direction of the wiring member 11 is set smaller. Thereby, the width W1 of the connection region C can be set to be lager than the substantially half of the width W2 of the wiring member 11. The reason is that when the wiring member 11 is nearly flat, the width of a region in which a distance between the wiring member 11 and the solar cell 10 (connecting electrode 40) is substantially equal to or smaller than the diameter of the particle 13 can be set to be large.

2. Second Embodiment

A second embodiment of the present invention will be described by referring to the drawings. The present embodiment is different from the first embodiment in that a connecting electrode has protruding portions protruding to a wiring member. Accordingly, portions same as or similar to those of the first embodiment will not be omitted below.

(Configuration of a Solar Cell String)

Figure 7:
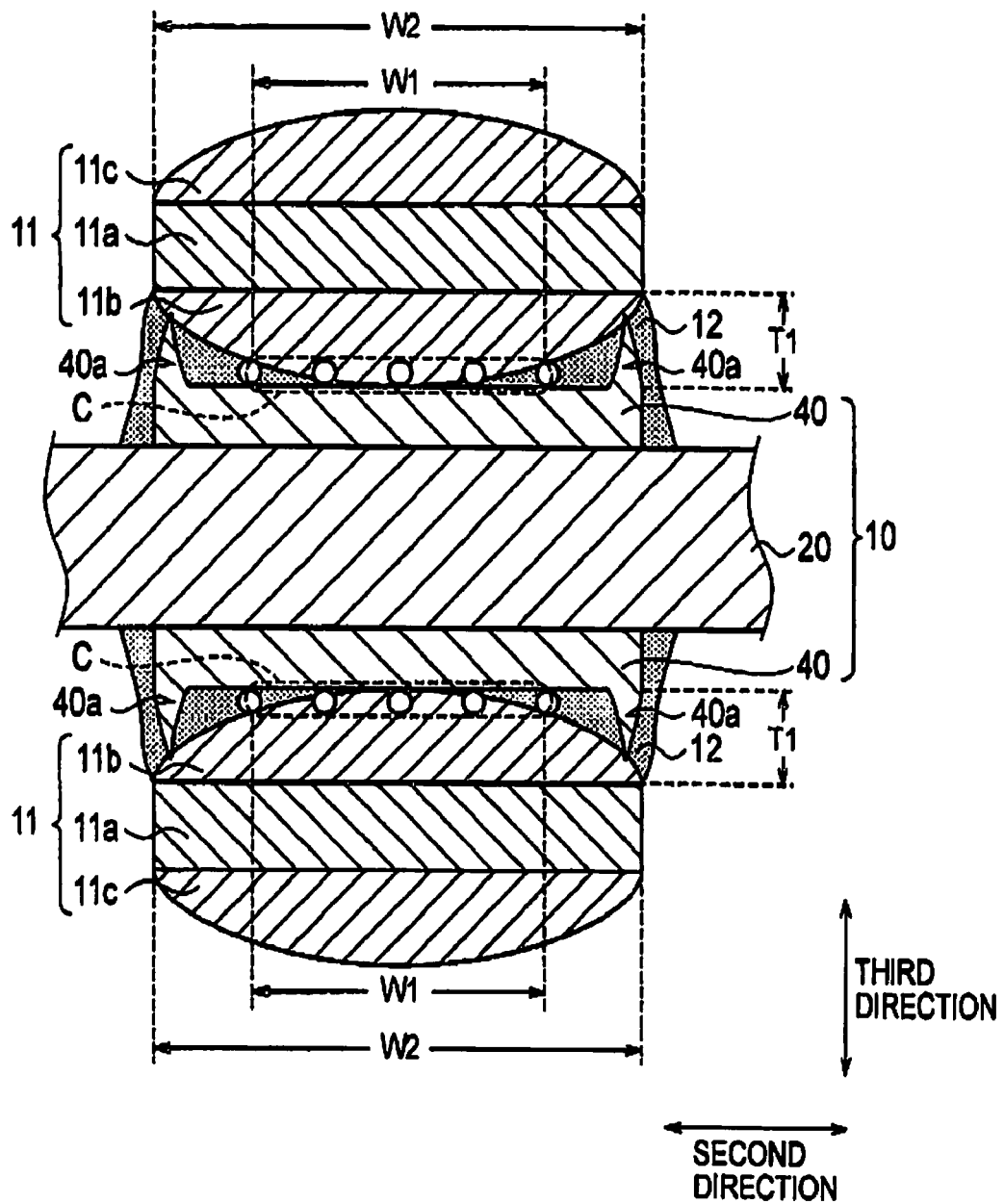
FIG. 7 is an enlarged cross-sectional view of a solar cell module 100 according to a second embodiment of the present invention.

The configuration of a solar cell string 1 according to the present embodiment will be described by referring to FIG. 7. FIG. 7 is an enlarged cross-sectional view taken along the B-B line in FIG. 4.

As shown in FIG. 7, a connecting electrode 40 according to the present embodiment has protruding portions 40a formed protruding toward a wiring member 11. The protruding portions 40a are formed in each edge portion of the connecting electrode 40 in a second direction. The protruding portions 40a dig into a soft conductor 11b included in the wiring member 11. It is preferable that a height of the protruding portion 40a in a third direction be substantially equal to a thickness T1 of the soft conductor 11b. Such protruding portion 40a can be formed by the following first to third approaches.

In the first approach, a distance between a frame body for fixing a screen and a photoelectric conversion part 20 is set to be larger when the connecting electrode 40 is formed on the photoelectric conversion part 20 by a screen printing method.

Firstly, the photoelectric conversion part 20 and the frame body are fixed with a predetermined distance. Subsequently, a silver paste is pushed out from an opening portion of the screen onto the photoelectric conversion part 20. At that time, the screen is impressed to the photoelectric conversion part 20 side by squeegee and then jumps back to the original position.

Here, the screen has a portion in which an opening portion of wires stretched in a lattice form on the frame body is closed by emulsion and a portion in which emulsion is lost in a shape of the connecting electrode 40. Accordingly, the silver paste is lifted up by being stretched by the screen in an interface between the portion in which emulsion is formed and the portion where emulsion is lost when the screen jumps up. Thereby, the protruding portion 40a is formed in each edge portion of the connecting electrode 40. Such protruding portion 40a can be formed higher as the jumping-up of the screen is larger, that is, as the distance between the frame body for fixing the screen and the photoelectric conversion part 20 is larger.

In the second approach, a printing speed is increased when the connecting electrode 40 is formed on the photoelectric conversion part 20 by the screen printing method. The printing speed means a moving speed of the squeegee when the silver paste is pushed out from the opening portion of the screen onto the photoelectric conversion part 20.

When the moving speed of the squeegee is increased, the screen jumps up faster. When the screen jumps up fast, the silver paste is pulled by the screen in the interface between the portion where emulsion is formed and the portion where emulsion is lost. Thereby, the protruding portion 40a is formed in each edge portion of the connecting electrode 40. Such protruding portion 40a can be formed higher as the screen jumps up faster, that is, as the printing speed is increased.

In the third approach, a viscosity of the silver paste which is a material for the connecting electrode 40 is increased when the connecting electrode 40 is formed on the photoelectric conversion part 20 by the screen printing method. As described above, the silver paste is lifted up together with the screen in the interface between the portion where emulsion is formed and the portion where emulsion is lost. At that time, the silver paste is easily pulled by the screen as the viscosity thereof becomes higher. In other words, as the viscosity of the silver paste becomes higher, the protruding portion 40a can be formed higher.

Note that in the present embodiment, as shown in FIG. 7, the circumference of the wiring member 11 is convexly formed toward the connecting electrode 40. Thereby, the width W1 of the connection region C in the second direction is larger than the substantially half of the width W2 of the wiring member 11.

(Advantageous Effects)

In the solar cell module 100 according to the present embodiment, similarly to the first embodiment, the cross-sectional circumference substantially perpendicular to the first direction of the wiring member 11 is convexly formed toward the connecting electrode 40. The width W1 of the connection region C is larger than the substantially half of the width W2 of the wiring member 11.

Accordingly, in the process of connecting the wiring member 11, the degassing of the resin adhesive 12 can be promoted. At the same time, the wiring member 11 and the connecting electrode 40 can be electrically connected in the connection region C.

Furthermore, in the solar cell module 100 according to the present embodiment, the connecting electrode 40 has the protruding portion 40a formed protruding toward the wiring member 11. The protruding portion 40a is formed in each edge portion of the connecting electrode 40 in the second direction and digs into the wiring member 11.

As described above, the protruding portion 40a digs into the wiring member 11. Thereby, the mechanical connection strength between the wiring member 11 and the connecting electrode 40 can be improved and the electrical connection between the wiring member 11 and the connecting electrode 40 can be also improved. Consequently, the collecting efficiency of the solar cell 10 and the adhesiveness of the wiring member 11 can be further improved.

3. Third Embodiment

A third embodiment of the present invention will be described below by referring to the drawings. The present embodiment is different from the first embodiment in that a solar cell according to the present embodiment does not include a connecting electrode as a collecting electrode. Accordingly, portions same as or similar to those of the first embodiment will not be described in the following description.

(Schematic Configuration of a Solar Cell Module)

Figure 8:
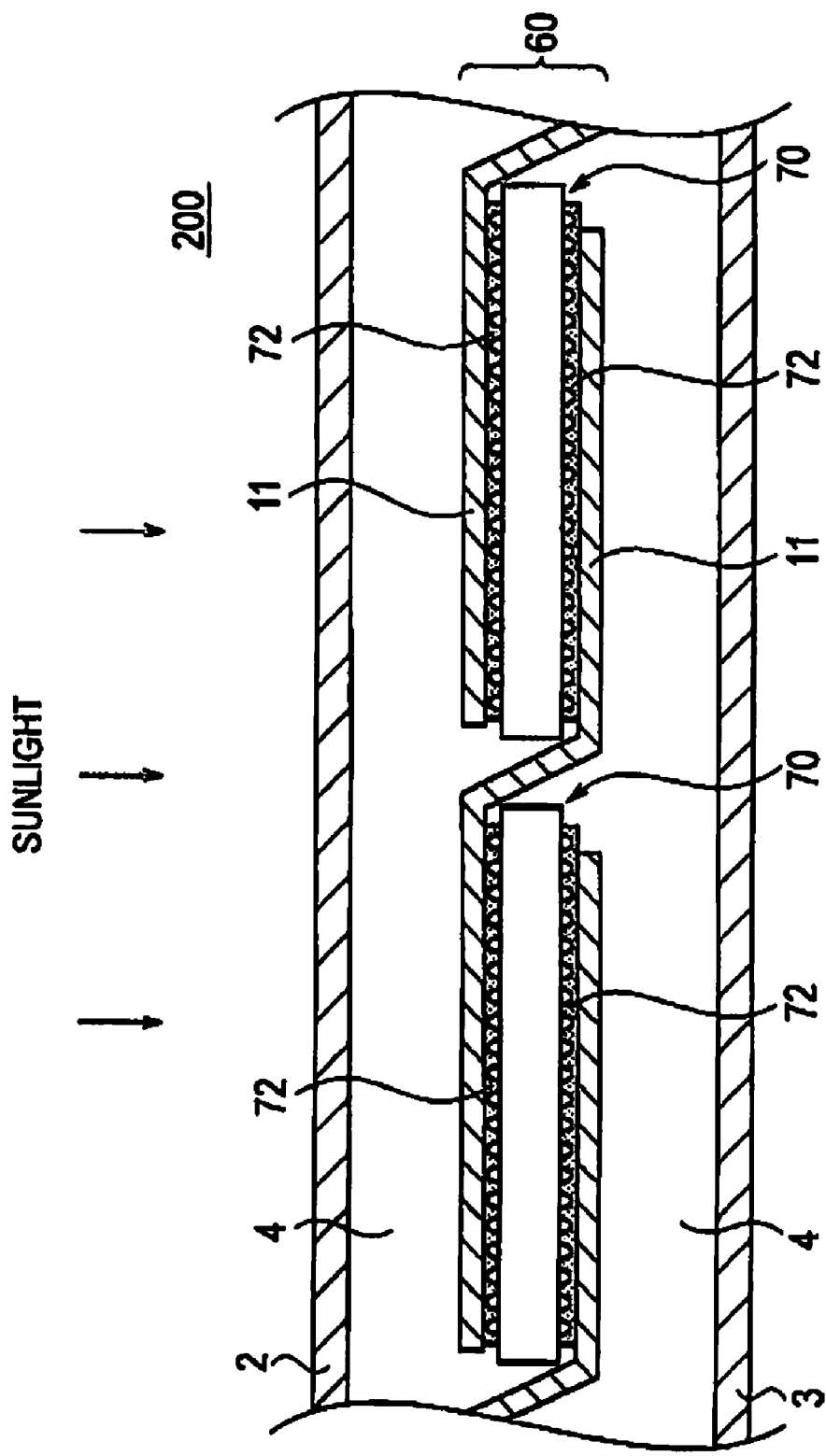
FIG. 8 is a side view of a solar cell module 200 according to a third embodiment of the present invention.

A schematic configuration of a solar cell module 200 according to the present embodiment will be described by referring to FIG. 8. FIG. 8 is an enlarged side view of the solar cell module 200 according to the present embodiment.

The solar cell module 200 is configured by causing a solar cell string 60 to be sealed with a sealing member 4 between a light-receiving surface side protection member 2 and a back surface side protection member 3.

The solar cell string 60 includes multiple solar cells 70, wiring members 11, and resin adhesive 72. The solar cell string 60 is configured by connecting the multiple solar cells 70 to each other arranged in a line in a first direction through the wiring members 11.

The resin adhesive 72 is a belt-like film sheet adhesive which is mainly formed of an epoxy resin. However, the resin adhesive 72 does not include conductive particles.

The configurations of other portions are similar to those of the first embodiment.

(Configuration of the Solar Cell)

Figure 9:
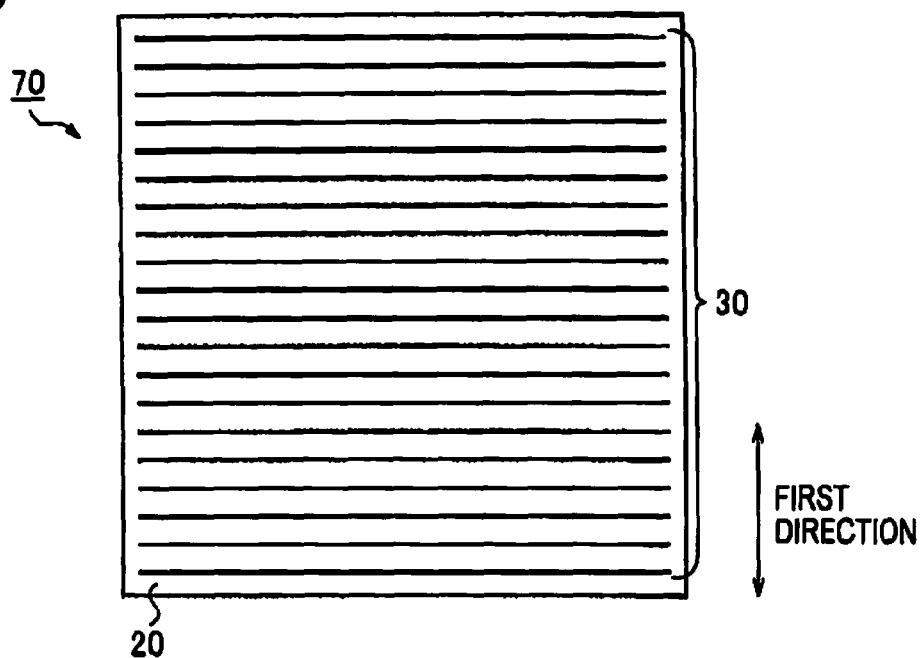
FIG. 9 is a plan view of a solar cell 10 according to the third embodiment of the present invention.

The configuration of the solar cell 70 will be described by referring to FIG. 9. FIG. 9 is a plan view of the solar cell 70 on the light-receiving surface side.

As shown in FIG. 9, the solar cell 70 includes a photoelectric conversion part 20 and thin wire electrodes 30. The solar cell 70 does not include a connecting electrode as a collecting electrode.

The configurations of other portions are similar to those of the first embodiment.

(Configuration of the Solar Cell String)

Figure 10:
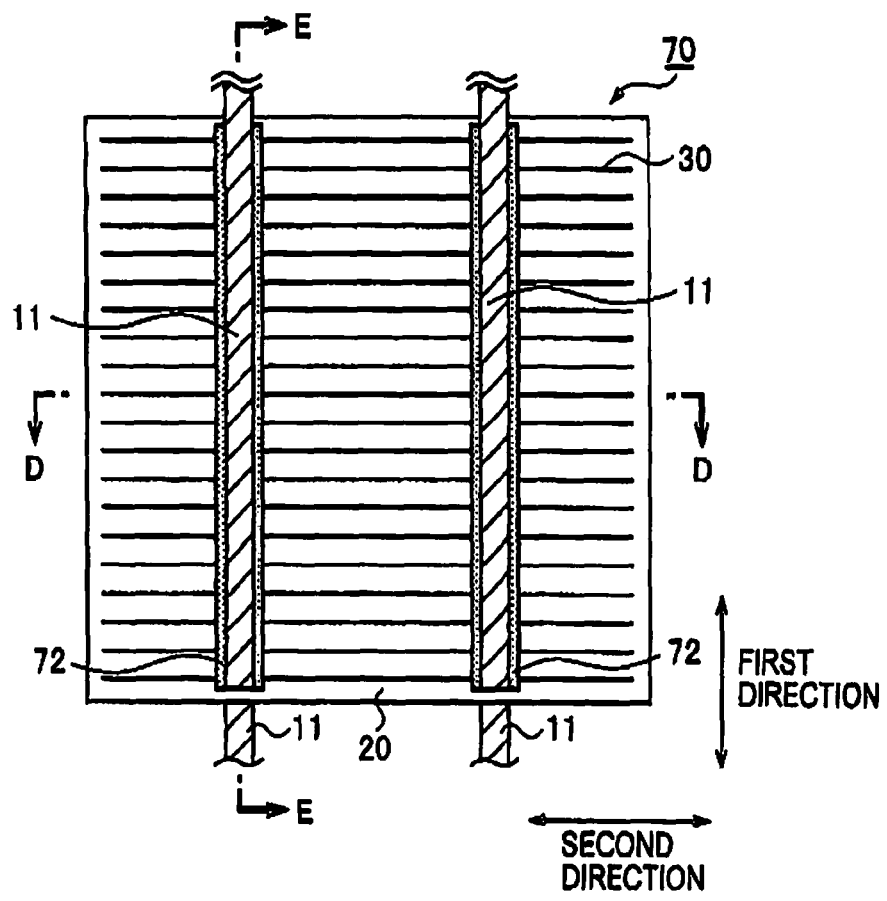
FIG. 10 is a view showing a state where a wiring member 11 is bonded to a solar cell 10 according to the third embodiment of the present invention.
Figure 11:
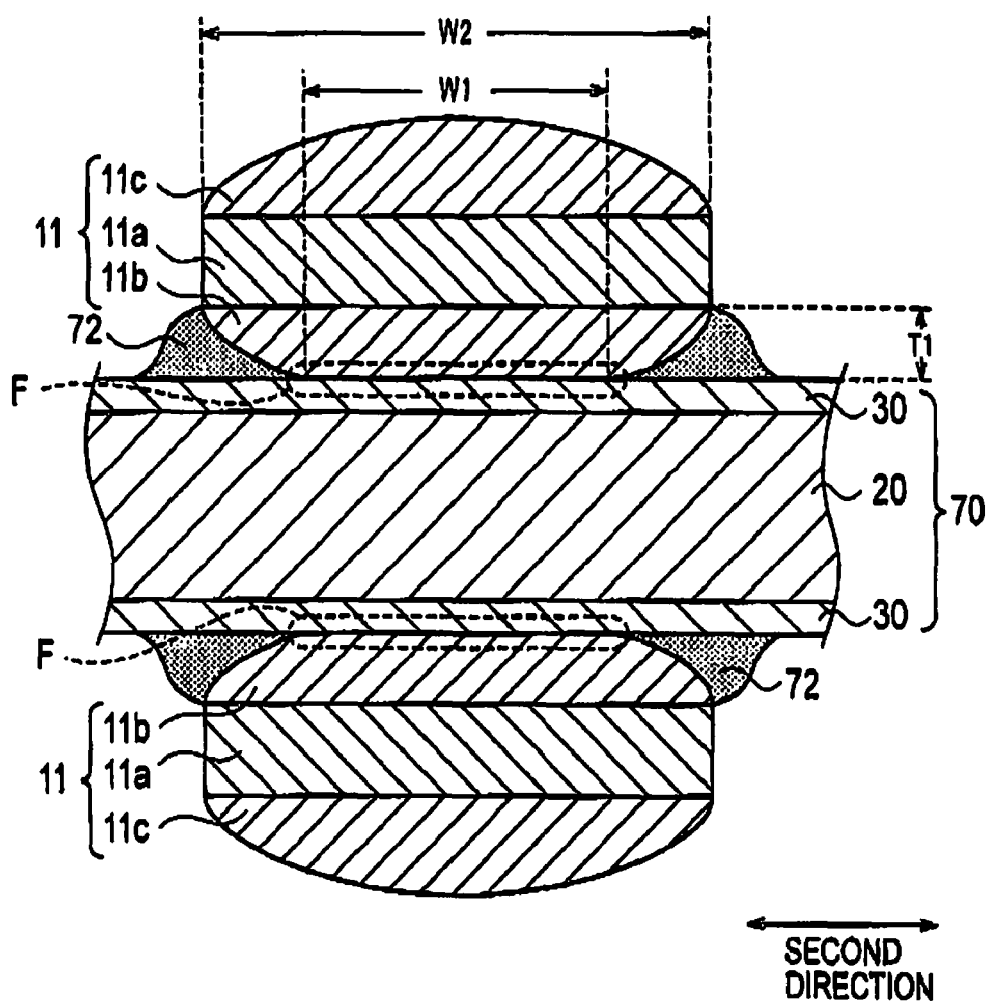
FIG. 11 is a cross-sectional view taken along the D-D line in FIG. 10.
Figure 12:
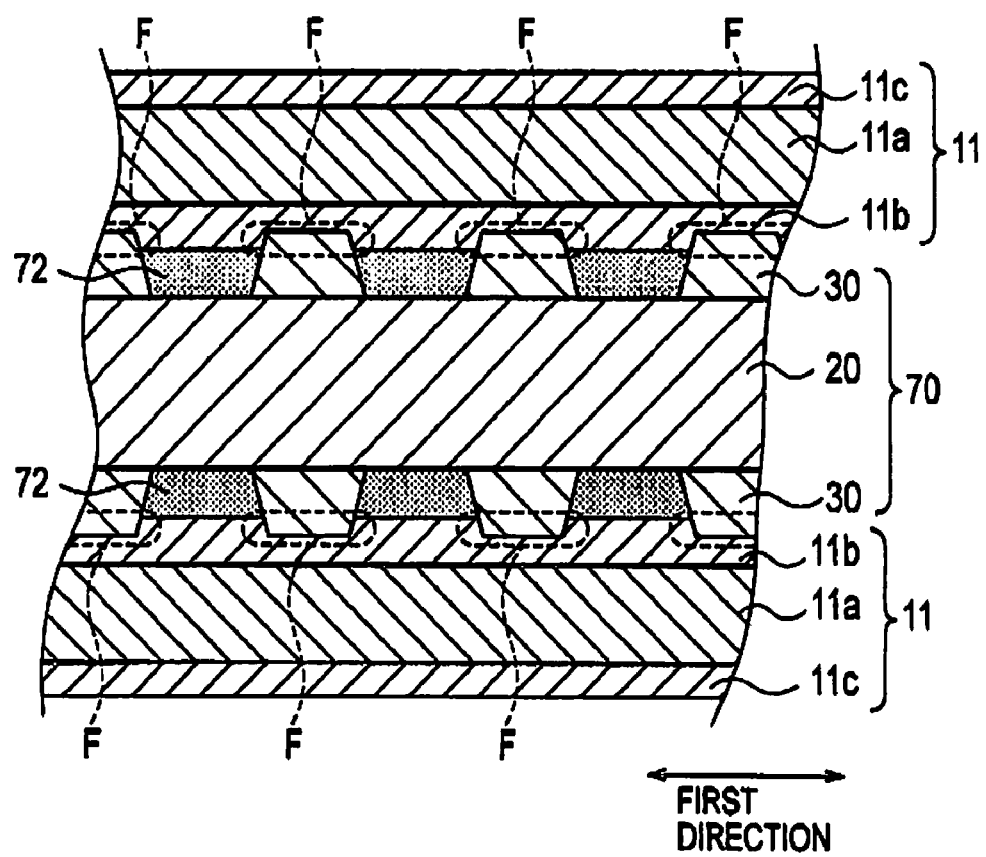
FIG. 12 is a cross-sectional view taken along the E-E line in FIG. 10.

Next, the configuration of the solar cell string 60 will be described by referring to FIGS. 10 to 12. FIG. 10 shows a state where the wiring members 11 are arranged on the solar cell 70. FIG. 11 is an enlarged cross-sectional view taken along the D-D line in FIG. 10. FIG. 12 is an enlarged cross-sectional view taken along the E-E line in FIG. 10.

As shown in FIG. 10, the resin adhesive 72 is provided for 2 lines along the first direction on the solar cell 70. In addition, the wiring member 11 is arranged in the first direction on the resin adhesive 72. A width of the wiring member 11 in the second direction is smaller than a width of the resin adhesive 72.

In this manner, the resin adhesive 72 and the wiring member 11 are sequentially placed on the solar cell 70.

As shown in FIG. 11, the wiring member 11 includes a low resistivity 11a, a soft conductor 11b, and a soft conductor 11c. A width of the wiring member 11 in the second direction is W2.

A thickness T1 of the soft conductor 11b gradually becomes smaller from the center portion of the second direction to the edge portions in a third direction substantially vertical to the principal surface of the solar cell 70. In other words, the cross-sectional circumference substantially perpendicular to the first direction of the wiring member 11 is formed toward the solar cell 70.

As shown in FIG. 12, an upper edge portion of the thin wire electrode 30 is embedded in the soft conductor 11b. In other words, one portion of the thin wire electrode 30 is embedded in the wiring member 11. Thereby, the thin wire electrode 30 and the wiring member 11 are electrically and mechanically connected to each other.

In the present embodiment, as shown in FIGS. 11 and 12, a region where the thin wire electrode 30 and the soft conductor 11b are electrically connected is referred to as a connection region F. The connection region F is formed by embedding the one portion of the thin wire electrode 30 in the wiring member 11.

Here, as shown in FIG. 11, the width W1 of the connection region F in the second direction is larger than the substantially half of the width W2 of the wiring member 11.

(Method for Manufacturing the Solar Cell Module)

Next, a method for manufacturing the solar cell module 200 according to the present embodiment will be described below.

Firstly, the photoelectric conversion part 20 similar to that described in the first embodiment is manufactured.

Subsequently, an epoxy-based thermosetting silver paste is provided in several lines on the light-receiving surface and back surface of the photoelectric conversion part 20 along the second direction by using a printing method, such as a screen printing method or offset printing method. The silver paste is then heated under a predetermined condition to volatize solution, and thereafter is further heated to be completely dried. In this manner, the thin wire electrode 30 is formed. In this way, the solar cell 70 is manufactured.

Thereafter, the wiring member 11 is thermocompressively bonded onto the solar cell 70 using the resin adhesive 72. Thereby, the wiring member 11 and the solar cell 70 are mechanically and electrically connected. In specific, firstly, the resin adhesive 72 and the wiring member 11 are sequentially provided on each of the light-receiving surface and back surface of the photoelectric conversion part 20. Subsequently, the wiring member 11 is pressed for approximately 15 seconds to the solar cell 70 by using a heater block which is heated at approximately 180° C.

The electrical connection between the wiring member 11 and the solar cell 70 is formed in a region in which the one portion of the thin wire electrode 30 is embedded in the wiring member 11, that is, the connection region F. Here, in the present embodiment, a width W1 of the connection region F in the second direction is Bet to be larger than a substantially half of the width W2 of the wiring member 11.

Specifically, the following two approaches can be employed in order to cause the width W1 of the connection region F to be larger than the substantially half of the width W2 of the wiring member 11.

In the first approach, a pressure of impressing the wiring member 11 to the solar cell 70 by the heater block 50 is set to be equal to or larger than a predetermined value.

In the second approach, a curvature of the circumference of the wiring member 11 in the cross-section substantially perpendicular to the first direction is set to be smaller. In other words, the second approach uses a near-flat wiring member as the wiring member 11. Specifically, a speed of pulling out the low resistivity 11a from a plating bath of the soft conductor 11b or a shape of a dice to be used for pulling out the low resistivity 11a from the plating bath is changed to control the curvature of the circumference of the wiring member 11.

In the actual contact bonding process, the pressure of impressing the heater block 50 and the curvature of the circumference of the wiring member 11 work together integratedly, so that the width W1 of the connection region F is set to be larger than the substantially half of the width W2 of the wiring member 11. In this way, the solar cell string 60 is manufactured.

After that, an EVA (sealing member 4) sheet, solar cell string 60, EVA (sealing member 4) sheet, and PET sheet (back surface side protection member 3) are sequentially layered on a glass substrate (light-receiving surface side protective material 2) to form a layered body.

Then, the above-described layered body is temporarily bonded by thermocompression in a vacuum atmosphere, and thereafter is heated under a predetermined condition. Thereby, the EVA is completely cured. In this way, the solar cell module 200 is manufactured.

Note that a terminal box, an Al frame, or the like can be attached to the solar cell module 200.

(Advantages and Effects)

With the method for manufacturing the solar cell module 200 according to the present embodiment, the width W1 of the connection region F in which the wiring member 11 and the thin wire electrode 30 are electrically connected is set to be larger than the substantially half of the width W2 of the wiring member 11 in the thermocompression bonding process of the wiring member 11 using the resin adhesive 72 on the principal surface of the solar cell 70. The cross-sectional circumference substantially perpendicular to the first direction of the wiring member 11 is convexly formed toward the connecting electrode 40.

As described above, the circumference of the wiring member 11 is convexly formed toward the connecting electrode 40. Thus, in the thermocompression bonding process, the pressure is firstly applied to the center portion of the resin adhesive 72 in the second direction and then gradually applied to the edge portions. Accordingly, degassing of the resin adhesive 72 is gradually carried out from the center portion to the edge portions. As described above, the degassing of the resin adhesive 72 is promoted. Thereby, a mass of the gas can be prevented from being residual as a cavity in the resin adhesive 72 after the thermocompression bonding process.

In addition, in the thermocompression bonding process, the width W1 of the connection region F is set to be larger than the substantially half of the width W2 of the wiring member 11. Thereby, the electrical connection between the wiring member 11 and the solar cell 70 (thin wire electrode 30) can be sufficiently secured.

Consequently, the collecting efficiency of the solar cell 70 and the adhesiveness of the wiring member 11 with the solar cell 70 (thin wire electrode 30) can be improved.

4. Other Embodiments

The present invention has been described by using the above-described embodiments. However, it should be understood that the description and drawings constituting one part of the present disclosure are not intended to limit the present invention. In addition, various alternative embodiments, examples, operational techniques would be clear for those skilled in the art from this disclosure.

In the above-described embodiments, the multiple thin wire electrodes 30 are formed on the back surface of the photoelectric conversion part 20. However, the thin wire electrodes 30 may be formed so as to cover the entire back surface thereof. The present invention does not limit the shape of the thin wire electrode 30 formed on the back surface of the photoelectric conversion part 20.

In addition, in the first embodiment, the width of the resin adhesive 12 in the second direction is set to be larger than the width of the connecting electrode 40 in the second direction. However, the width of the resin adhesive 12 in the second direction may be substantially equal to or smaller than the width of the connecting electrode 40 in the second direction.

Moreover, in the second embodiment, the protruding portion 40a is formed so as to be smaller in height than the thickness T1 of the soft conductor 11b. However, the height of the protruding portion 40a may be formed so as to be higher than the thickness T1 of the soft conductor 11b. In other words, the protruding portion 40a may reach the low resistivity 11a.

Also, in the third embodiment, the width of the resin adhesive 72 in the second direction is set to be larger than the width of the wiring member 11 in the second direction. However, the width of the resin adhesive 72 in the second direction may be substantially equal to or smaller than the width of the wiring member 11 in the second direction.

As described above, the present invention, of course, includes various embodiments which are not described herein. Thus, the technical scope of the present invention is only limited by patent claims according to the scope of claims which is valid from the description above.

Examples of solar cells to be used in a solar cell module according to the present invention will be specifically described below. However, the present invention is not limited to the following examples and can be properly modified without departing from the scope of claims.

First to eighth examples and first to fifth comparative examples are manufactured based on the following table 1.

TABLE 1

| | Thickness of Solder (μm) | | Particle Diameter of Nickel | Connection | Solar Cell | |
|---|---|---|---|---|---|---|
| | Center Portion | Edge Portion | Particle (μm) | pressure (MPa) | Region (%) | Output Ratio |
| Comparative Example 1 | 40 | 10 | 5 | 0.5 | 20 | 91.5 |
| Comparative Example 2 | 40 | 10 | 5 | 1 | 40 | 96.5 |
| Example 1 | 40 | 10 | 5 | 2 | 50 | 99.3 |
| Example 2 | 40 | 10 | 5 | 3 | 55 | 99.5 |
| Example 3 | 40 | 10 | 10 | 0.5 | 50 | 99.5 |
| Example 4 | 40 | 10 | 10 | 1 | 55 | 99.5 |
| Example 5 | 40 | 10 | 10 | 2 | 60 | 99.6 |
| Example 6 | 40 | 10 | 10 | 3 | 70 | 99.7 |
| Comparative Example 3 | 40 | 10 | 2 | 2 | 40 | 95.3 |
| Comparative Example 4 | 40 | 10 | 2 | 3 | 45 | 97.8 |
| Example 7 | 30 | 10 | 5 | 1 | 55 | 99.5 |
| Example 8 | 20 | 10 | 5 | 1 | 60 | 99.7 |
| Comparative Example 5 | 10 | 10 | 5 | 1 | 30 | 93.3 |

EXAMPLES

Firstly, an n-type single crystal silicon substrate with the size of 100 mm square is used to manufacture a photoelectric conversion part.

Subsequently, an epoxy-based thermosetting silver paste is used to form a thin wire electrode and a connecting electrode in a comb shape on a light-receiving surface and back surface of a photoelectric conversion part by a screen printing method. The thickness (height) and width of the connecting electrode are respectively set to be 50 μm and 1.5 mm. In this way, a solar cell is manufactured.

Next, a wiring member in which SnAgCu-based solder is plated in a convex form is prepared on upper and lower surfaces of a flat copper foil with the width of 1.5 mm. Specifically, thicknesses of the center portion and edge portions of the wiring member in a width direction are changed for each example as shown on the table 1.

The thickness of the wiring member is controlled by changing the shape of a dice which is a member for pulling out a copper foil from a solder bath.

Then, an epoxy resin adhesive is applied on each of the connecting electrode formed on the light-receiving surface of one solar cell and the connecting electrode formed on the back surface of another solar cell adjacent to the one solar cell. The epoxy resin adhesive used is the one in which approximately 50000 nickel particles are mixed in 1 mm³ of the epoxy region. The diameter of the nickel particle is set for each example as shown on the table 1.

After that, the wiring member is arranged on the epoxy resin adhesive.

Next, a pressure is applied from upper and lower sides of the wring material by using a metal head which is heated at 200° C., and the wiring member is heated for 60 seconds. The pressure applied by the meal head is set for each example as shown on the table 1.

In this way, the solar cells according to the first to eighth examples are manufactured.

COMPARATIVE EXAMPLES

Solar cell strings according to first to fifth comparative examples of the present invention have been manufactured based on the table 1. Methods for manufacturing the comparative examples are different from the method for manufacturing the examples in settings of the thicknesses of the center portion and edge portions of the wiring member in the width direction, the diameters of nickel particles, and the pressures applied by the metal head.

The other processes are similar to those of the above-described examples.

(Output Measurement)

By referring to the table 1, energy outputs of the solar cells according to the first to eighth examples and the first to fifth comparative examples will be examined below. The energy outputs thereof are measured before and after thermocompression bonding of the wiring member.

On the table 1, an energy output ratio means a relative value of solar cell energy output after thermocompression bonding of the wiring member in relation to solar cell energy output before the thermocompression bonding of the wiring member.

In addition, with regard to each of the first to eighth examples and the first and fifth comparative examples, a width of a connection region in which the wiring member and the connecting electrode are electrically connected is measured. Here, the connection region means a region in which a distance between solder and the connecting electrode is equal to or smaller than the diameter of the nickel particle. On the table 1, the width of the connection region in relation to the width of the wiring member in the second direction is shown by a relative value.

From the results of the first and second comparative examples and the first and second examples, it is confirmed that the connection region can be increased by causing the contact bonding pressure of the wiring member to be higher. In addition, it is observed that energy output deterioration of the solar cell can be suppressed as the connection region is larger. This result shows an achievement of smaller contact resistance between the wiring member and the connecting electrode by increasing the connection region.

Similarly, it is also observed from the results of the third to sixth examples that energy output deterioration of the solar cell can be suppressed by increasing the connection region by increasing the contact bonding pressure of the wiring member.

In addition, when comparing the results of the first and second examples, the third to sixth examples, and the third and fourth comparative examples, it is observed that energy output deterioration of the solar cell can be suppressed when the diameter of the nickel particle is increased. This is because the connection region is a region in which a distance between solder and the connecting electrode is equal to or smaller than the diameter of the nickel particle. Note that the connection region is formed by the nickel particles in the epoxy rein adhesive.

When the results of the second comparative example and the results of the seventh and eighth examples are compared, it is observed that the connection region can be increased as a difference in thickness between the center portion and edge portions of solder is smaller. This is because the width of the connection region formed by the nickel particle can be increased as the wiring member becomes nearly flat.

In contrast, from the result of the fifth comparative example, when the wiring member is flatly formed, it is observed that the connection region is extremely decreased. As a result, energy output of the solar cell is extremely decreased by the thermocompression bonding of the wiring member. This is because the degassing of the epoxy resin adhesive cannot be promoted due to the flat formation of the wiring member. Thereby, the mass of the gas in the epoxy resin adhesive becomes residual as a cavity. In other words, in the first to eighth examples, the degassing of the epoxy resin adhesive is promoted.

What is claimed is:

1. A solar cell module comprising first and second solar cells arranged in a line in a first direction and a wiring member electrically connecting the first and second solar cells, wherein
the first and second solar cells each include a photoelectric conversion part configured to produce photogenerated carriers by receiving light and a collecting electrode which is formed on a principal surface of the photoelectric conversion part and is configured to collect the photogenerated carriers,
the wiring member is provided in the first direction on the principal surfaces of the first and second solar cells,
a resin adhesive is provided between the wiring member and the principal surfaces of the first and second solar cells,
a cross section of the wiring member is convexly formed toward the first and second solar cells, the cross section being substantially perpendicular to the first direction, and
in a second direction substantially perpendicular to the first direction, a width of a connection region in which the wiring member and the collecting electrode are electrically connected is larger than a substantially half a width of the wiring member in an edge portion of the wiring member in the second direction, the wiring member and the collecting electrode are connected by a resin in the resin adhesive, the resin continuing from a surface of the wiring member to a surface of the collecting electrode.

2. The solar cell module according to claim 1, wherein
the collecting electrode includes a plurality of thin wire electrodes configured to collect the generated carriers from the photoelectric conversion part and a connecting electrode configured to collect the photogenerated carriers from the thin wire electrodes,
the connecting electrode is formed in the first direction,
the wiring member is provided on the connecting electrode,
the resin adhesive includes a plurality of conductive particles, and
the connection region is formed by the particles included in the resin adhesive.

3. The solar cell module according to claim 2, wherein
the connecting electrode has a protruding portion convexly formed toward the wiring member,
the protruding portion is formed in an edge portion of the connecting electrode in the second direction, and
the protruding portion digs in the wiring member.

4. The solar cell module according to claim 1,
wherein the collecting electrode includes a plurality of thin wire electrodes configured to collect the photogenerated carriers from the photoelectric conversion part, and
the connection region is formed by embedding portions of the thin wire electrodes in the wiring member.

* * * * *